(12) United States Patent
Glovatsky et al.

(10) Patent No.: US 6,449,839 B1
(45) Date of Patent: Sep. 17, 2002

(54) ELECTRICAL CIRCUIT BOARD AND A METHOD FOR MAKING THE SAME

(75) Inventors: Andrew Z. Glovatsky, Livonia; Thomas Krautheim, Belleville; Robert E. Belke, Jr., West Bloomfield; Vivek Amir Jairazbhoy, Farmington Hills; Cuong V. Pham, Belleville, all of MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/655,986

(22) Filed: Sep. 6, 2000

(51) Int. Cl.[7] .................................................. H05K 3/02
(52) U.S. Cl. ........................ 29/847; 29/831; 29/840; 156/155; 216/15; 216/52
(58) Field of Search ................... 29/846, 847, 831, 29/840; 156/155, 180, 327, 330; 216/15, 13, 20, 52

(56) References Cited

U.S. PATENT DOCUMENTS

| | | | |
|---|---|---|---|
| 3,801,388 A | | 4/1974 | Akiyama et al. |
| 4,289,846 A | * | 9/1981 | Parks et al. ................. 430/314 |
| 4,404,059 A | | 9/1983 | Livshits et al. |
| 4,561,173 A | * | 12/1985 | Te velde ....................... 29/577 |
| 5,308,440 A | * | 5/1994 | Chino et al. ................. 156/664 |
| 5,408,742 A | * | 4/1995 | Zaidel et al. .................. 29/846 |
| 5,738,797 A | | 4/1998 | Belke, Jr. et al. |
| 6,020,215 A | * | 2/2000 | Yagi et al. ..................... 438/52 |
| 6,218,282 B1 | * | 4/2001 | Buynoski .................... 438/619 |
| 6,248,247 B1 | * | 6/2001 | Goenka et al. ............... 216/15 |
| 6,265,321 B1 | * | 7/2001 | Chooi et al. ................ 438/725 |
| 6,268,262 B1 | * | 7/2001 | Loboda ....................... 438/422 |
| 6,287,979 B1 | * | 9/2001 | Zhou et al. ................. 438/723 |
| 6,297,145 B1 | * | 10/2001 | Ito .............................. 438/619 |
| 6,214,719 B1 | * | 4/2002 | Nag ............................ 438/619 |
| 6,217,783 B1 | * | 4/2002 | Goenka et al. ............... 216/15 |

* cited by examiner

Primary Examiner—Kamand Cuneo
Assistant Examiner—José H Alcalá
(74) Attorney, Agent, or Firm—Visteon Global Tech., Inc.

(57) ABSTRACT

A method for forming connections within a multi-layer electronic circuit board 10. In one non-limiting embodiment, the method includes selectively forming air bridges over portions of the circuit board 10 and selectively collapsing the air bridges with a metallurgical bonding tool, effective to interconnect layers of the circuit board 10.

23 Claims, 5 Drawing Sheets

ELECTRICAL CIRCUIT BOARD AND A METHOD FOR MAKING THE SAME

FIELD OF THE INVENTION

The present invention relates to a method for making an electrical circuit board and more particularly, to a method for making a multi-layer electrical circuit board having interconnections between portions or layers of the circuit board.

BACKGROUND OF THE INVENTION

Multi-layer circuit boards contain and/or include electrical components which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires one or more vias, apertures and/or holes to be drilled, etched and/or formed through the core of the circuit board substrate, thereby Selectively creating one or more vial, apertures and/or holes which pass through and/or traverse some or all of the component containing surfaces and/or layers of the circuit board. The vias are then typically filled with solder (e.g., a pin or component connector is soldered into the hole). In this manner, electrical connections are made or formed which connect electrical components and/or circuitry to the core of the circuit board substrate, or to other components and/or circuitry located on the opposing side or surface of the board.

It is further desirable to form "air-bridges" or "crossover" type circuits upon and/or within the various surfaces, layers and/or component containing portions of the formed circuit board in order to allow multiple layers or levels of circuits and/or electrical interconnections to be formed upon a single board surface and/or within a component containing portion of the circuit board. In this manner, an increased amount or quantity of the electrical circuits may be created or formed upon and/or within the circuit board, thereby desirably increasing the density of the contained circuitry.

Prior methods for physically and electrically interconnecting layers or portions of multi-layered circuit boards are often relatively complicated, costly and time consuming. These prior methods have also resulted in relatively unreliable or defective connections to be formed, thereby causing certain portions of the formed circuit boards to be unusable or to malfunction.

There is therefore a need for a method for producing a multi-layer electrical circuit board which overcomes some or all of the previously delineated drawbacks of prior circuit boards and which utilizes "vias" and/or "air bridges" in a relatively uncomplicated and cost effective manner to form highly reliable physical and electrical interconnections between one or more layers of electrical circuitry.

SUMMARY OF THE INVENTION

It is a first object of the present invention to provide a method for producing a multi-layer electrical circuit board that overcomes some or all of the previously delineated drawbacks of prior multi-layer electrical circuit board forming methodologies and techniques.

It in a second object of the invention to provide a method for producing a multi-layer electrical circuit board which overcomes some or all of the previously delineated drawbacks of prior multi-layer electrical circuit board forming methodologies and techniques and which allows for the selective, efficient, and reliable interconnection between some or all of the various component containing surfaces and portions of the formed multi-layer electrical circuit board.

According to a first aspect of the present invention, a method for forming a connection within a multi-layer circuit board is provided. The multi-layer circuit board includes a core member having a top surface and a bottom surface, and first and second conductive members, which are respectively attached to the top and the bottom surface of the core member. The method includes the steps of: selectively removing a portion of the core member, effective to cause a portion of the first conductive member to form an air bridge over the second conductive member; providing a bonding tool; imparting a force upon the air bridge by use of the bonding tool, the force being effective to collapse a portion of the air bridge; and bonding the collapsed portion of the air bridge to the second conductive member, thereby connecting the first conductive member to the second conductive member.

According to a second aspect of the present invention, a multi-layer circuit board assembly is provided. The circuit board assembly includes a first circuit portion having a top surface and a bottom surface; a first pre-circuit assembly which is attached to the top surface of the first circuit portion and which includes a top conductive layer; a second pre-circuit assembly which is attached to the bottom surface of the first circuit portion and which includes a bottom conductive layer; an aperture which is formed through the first circuit portion, the first pre-circuit assembly and the second pre-circuit assembly; and a plurality of tab portions which are integrally formed from the top conductive layer, which extend through the aperture and which are coupled to the bottom conductive layer, thereby connecting the top conductive layer to the bottom conductive layer.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
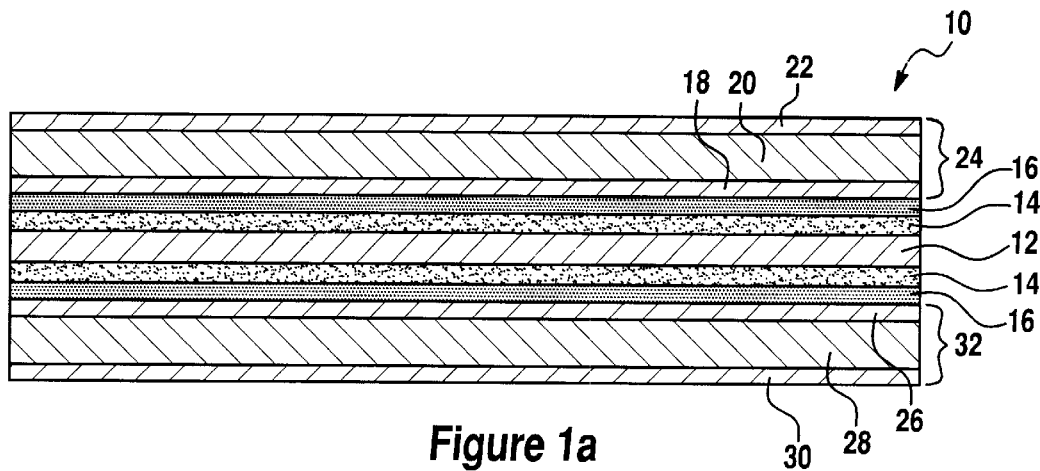
FIGS. 1(a)–(d) are successive sectional side views of a multi-layer circuit board being produced and/or formed in accordance with the teachings of a first embodiment of the invention.

Referring now to FIGS. 1(a)–(d), there is shown a method for interconnecting layers of a circuit assembly 10, which is performed in accordance with the teachings of the preferred embodiment of the invention. Circuit assembly 10 in formed by "building up" or sequentially adding various layers of certain materials to a core or ground member or layer 12, in a conventional manner. Core member 12 is manufactured and/or formed from an electrically conductive material such as copper or a metallic and electrically conductive foil material. A pair of substantially identical layers of dielectric material or conventional epoxy 14 are respectively applied/coupled to and substantially "cover" the "top" and "bottom" surfaces of member 12. Two layers of a conventional adhesive material 16 are applied/coupled to and substantially "cover" or coat the respective "outer" surface of each epoxy layer 14.

Circuit assembly 10 further includes a pair of pre-circuit assemblies 24, 32. Each pre-circuit assembly 24, 32 respectively includes a core metal portion or layer 20, 28 which is preferably manufactured and/or formed from a conventional aluminum material, and a pair of electrically conductive layers 18, 22 and 26, 30 which are respectively attached to the opposing surfaces (e.g., top and bottom surfaces) of core metal portions 20, 28 and which are preferably manufactured and/or formed from a conventional copper material. While copper and aluminum are used to form circuit board 10 in the preferred embodiment of the invention, it should be appreciated that other metals and metal combinations can be used to form circuit board 10 and all of the other circuit boards described herein, and may include metals such as iron, nickel, silver, gold, tin and alloys thereof. Adhesive materials or layers 16 are disposed between each dielectric layer 14 and each pre-circuit assembly 24, 32 and respectively and operatively bond the conductive layers 18, 26 of each pre-circuit assembly 24, 32 to each dielectric layer 14. In one non-limiting embodiment of the invention, pre-circuit assemblies 24, 32 and/or electrically conductive members 18, 26 are connected, coupled, and/or attached to adhesive material 16 by use of a known and conventional laminating process such as a conventional "one-step" laminating process.

Figure 1B:
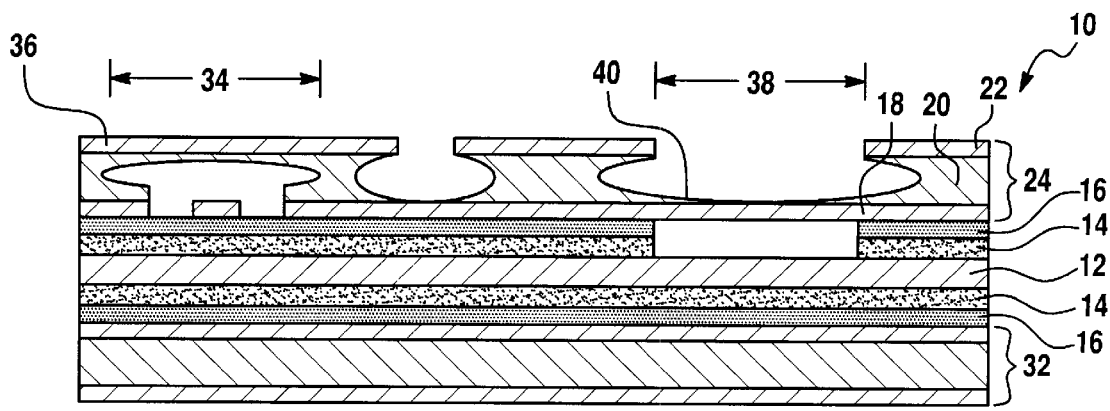

In the first step of the preferred interconnection method, certain portions of pre-circuit assembly 24, adhesive material 16, and dielectric layer 14 are selectively removed from the circuit assembly 10, as shown in FIG. 1(b). Particularly, in the preferred embodiment, portions of adhesive material 16 and dielectric material 14 are first selectively removed from an area or region 38 of the circuit assembly 10 in a conventional manner (e.g., by routing or machining). Portions of layers 22, 20 and 18 are then selectively removed from region 38 and from a region 34 by use of a conventional differential etching process or technique. The aforedescribed material removal or etching process is effective to create and/or form "air bridges" or crossover members 36 and 40. Particularly, a portion or "strip" of conductive member or layer 22 forms a "bridge" 36 which is disposed over a portion of conductive member or layer 18, and a portion or "strip" of conductive member or layer 18 forms a "bridge" 40 over a portion of core 12. In one non-limiting embodiment, portions of the aluminum layer 20 remain attached to the bridges 36, 40 and assist in the below described bonding process. In one non-limiting embodiment, portions of layers 22, 20 and 18 are selectively removed prior to the assembly of circuit board 10.

After bridges 36, 40 are formed, the bridges 36, 40 are metallized by use of a conventional plating process (e.g., an immersion process). In the preferred embodiment, bridges 36, 40 are metallized with a conductive metal such as silver, gold or nickel, or combination of these and other metals, thereby increasing the overall "conductivity" of the bridges 36, 40 and/or increasing the amount of charge or current that the bridges 36, 40 can effectively carry or transfer. The metalization of the bridges 36, 40 of the preferred embodiment additionally provide a metallurgically bondable surface finish for bonding or soldering.

Figure 1C:
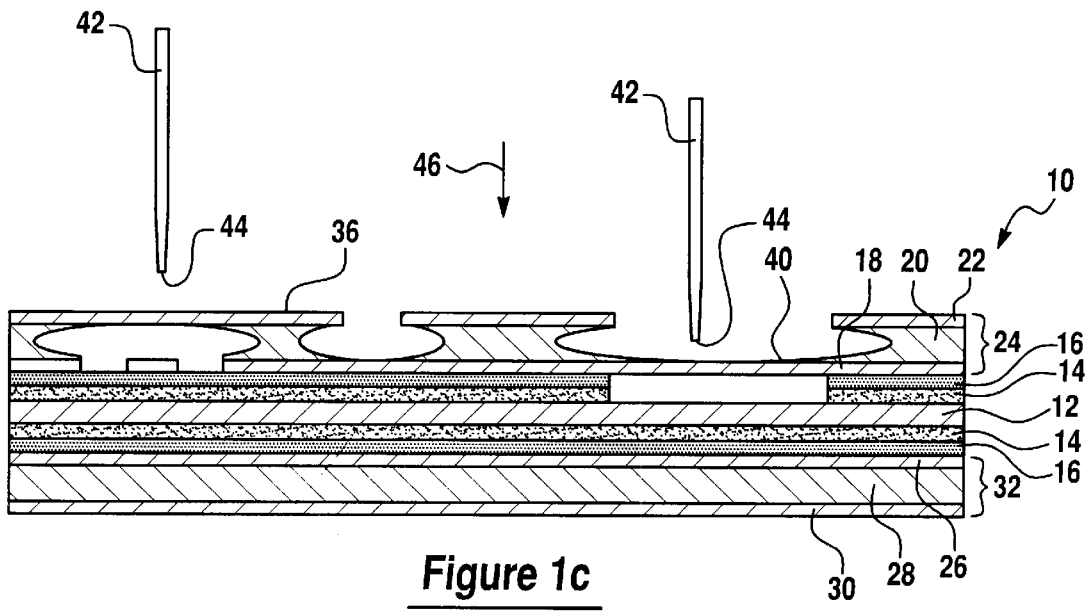
Figure 1D:
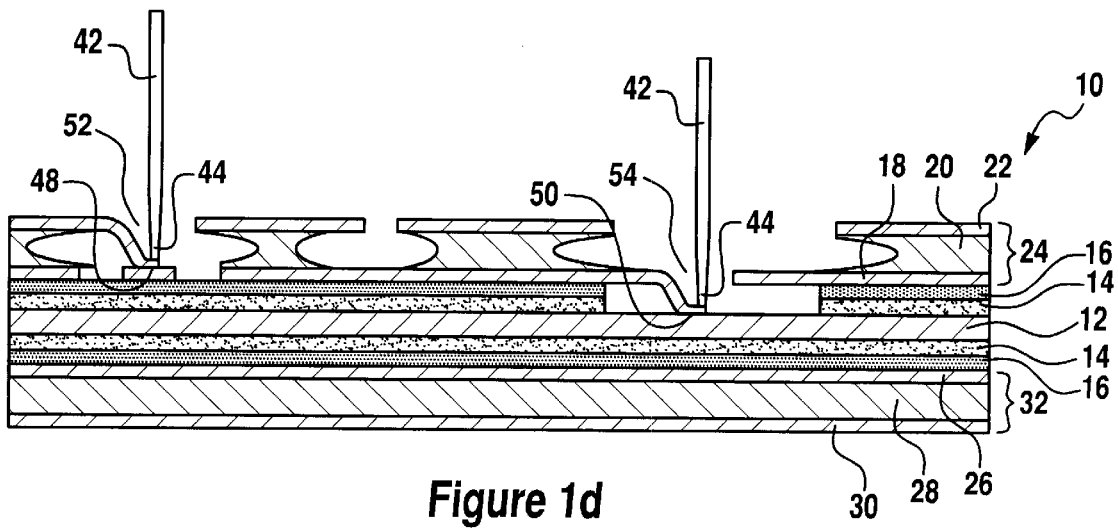

Referring now to FIG. 1(c), a conventional metallurgical bonding tool 42 (e.g., an ultrasonic or thermo-compression bonding tool) having a relatively sharp edge 44 is positioned over bridges 36, 40. Prior to the application of the bonding tool 42, the bridges 36, 40 may be etched with stress concentration features, such as notches, or the bridges may be etched through so that the bridge is severed prior to being joined, The bonding tool 42 is moved downward in the direction of arrow 46 from the position illustrated in FIG. 1(c) to the position illustrated in FIG. 1(d). The sharp edge 44 of bonding tool 42 contacts air bridges 36 and 40 and is effective to "sever" or "collapse" the air bridges 36, 40, thereby respectively forming interconnection apertures or vias 52, 54. Additionally, the downward force applied to the severed ends 48, 50, by the bonding tool 42 causes the severed ends 48, 50 to respectively and forcibly contact conductive layer 18 and core 12. Bonding tool 42 then introduces ultrasonic and/or thermal energy onto ends 48, 50, thereby respectively and physically bonding and/or joining the severed ends 48, 50 to conductive layer 18 and core 12. This forms a reliable interconnection between conductive layers 22 and 18, and between conductive layers 18 and 12. In other alternate embodiments, other types of bonding tools, methods and/or devices may be used to collapse air bridges 36, 40 and to bond members 22 and 18 and member 18 and 12.

Figure 1E:
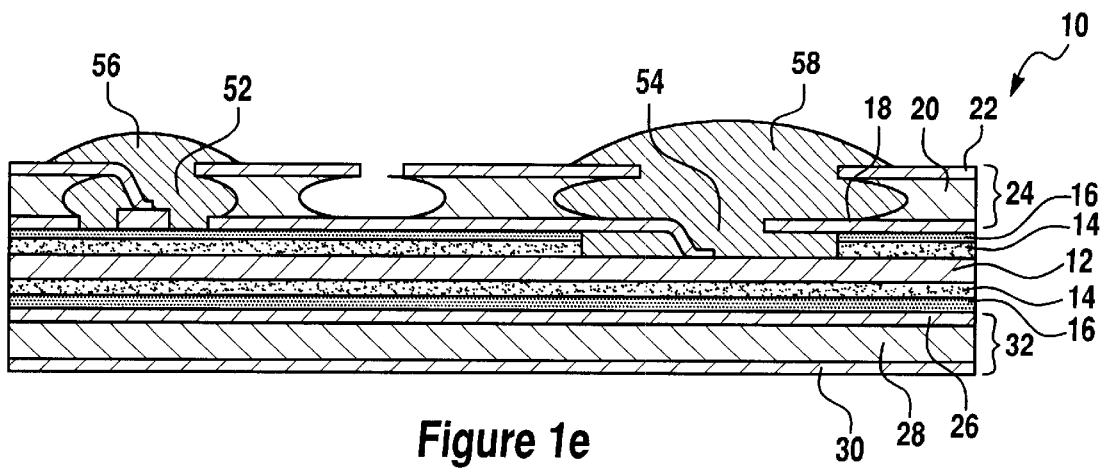
FIG. 1(e) is a sectional side view of a multi-layer circuit board being produced and/or formed in accordance with the teachings of a second embodiment of the invention.

In a second non-limiting embodiment, illustrated in FIG. 1(e), an amount of solder or conductive material 56 is selectively inserted into the formed aperture or via 52 after the layers 22 and 18 have been either ultrasonically bonded or simply formed into place. The conductive material 56 is effective to provide a more robust and reliable connection between layers 22 and 18. Additionally, an amount of solder or conductive material 58 is selectively inserted into formed aperture or via 54 after layers 18 and 12 are bonded. Solder material 58 is effective to further interconnect layer 22 with layers 18 and 12 and to provide more robust and reliable interconnections between layers 22, 18 and 12. In the preferred embodiment of the invention, solder material 56 and 58 is selectively inserted or deposited into vias 52 and 54 in a molten state. In alternative embodiments, solder material 56 and 58 is selectively inserted or deposited into vial 52 and 54 by use of a conventional compression printing technique.

Referring now to FIGS. 2(a)–(e), there is shown a method for interconnecting layers of a circuit assembly 60, which is performed in accordance with the teachings of the third embodiment of the invention. Circuit assembly 60 is formed by "building up" or sequentially adding various layers of certain materials to a core or ground member or layer 62, in a conventional manner. Core member 62 is manufactured and/or formed from an electrically conductive material such as copper or a metallic and electrically conductive foil material. A pair of substantially identical layers of dielectric material or conventional epoxy 64 are respectively applied/coupled to and substantially "cover" the "top" and "bottom" surfaces of member 62. Conventional adhesive material is preferably applied/coupled to and substantially "covers" or coats the respective "outer" surfaces of each epoxy layer 64, and is effective to bond layers 68 and 80 to layer 64.

Circuit assembly 60 further includes a pair of pre-circuit assemblies 66, 74. Each pre-circuit assembly 66, 74 respectively includes a core metal portion 70, 78 which is preferably manufactured and/or formed from a conventional aluminum material, and a pair of electrically conductive layers 68, 72 and 76, 80 which are respectively attached to the opposing surfaces of core metal portions 70, 78 and which are preferably manufactured and/or formed from a conventional copper material. Each pre-circuit assembly 66, 74 is respectively and operatively attached/coupled to each dielectric layer 64 by use of the conventional adhesive material. Circuit assembly 60 further includes a solder mask material 82 which is conventionally applied/coupled to portions of dielectric layer 64 and to conductive layer or member 72. The solder mask may also be applied to the bottom side of the substrate surfaces (i.e., 64 and 76).

Figure 2A:
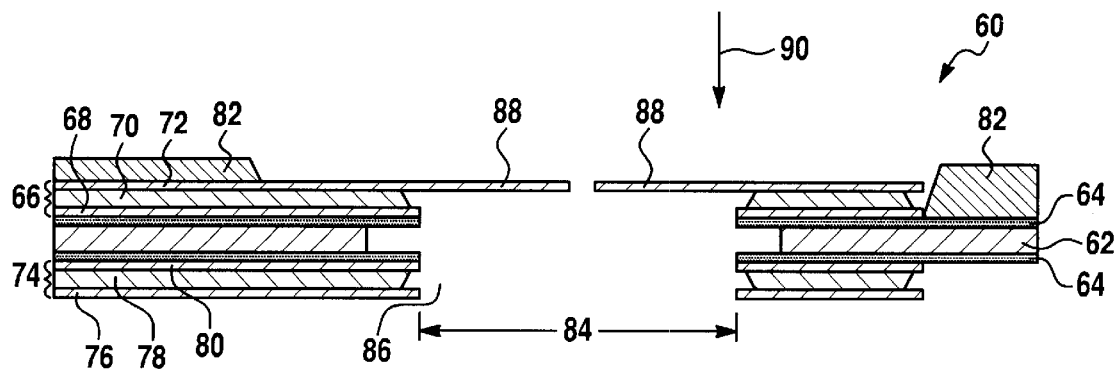
FIGS. 2(a)–(e) are successive sectional side views of a multi-layer circuit board being produced and/or formed in accordance with the teachings of a third embodiment of the invention.

In the first step of this interconnection method, certain portions of pre-circuit assemblies 66, 74, dielectric material 64, and core 62 are selectively removed from a region 84 of the circuit assembly 60, as shown in FIG. 2(a). Particularly, portions of layers 76–80, 68, 70 and 62 are selectively removed from region 84 by use of a conventional etching process, procedure or technique, and portions of dielectric material 64 are selectively removed from region 84 by use of a conventional mechanical process (e.g., by routing, drilling, or machining), thereby forming a cavity or via 86. Region 84 and via 86 are preferably generally circular in shape. The afore-described material removal or etching process is further effective to create and/or form portions, traces, or protrusions 88 of conductive layer or member 72 which remain or extend within via 86 and/or region 84. Core layer 62 it preferably further "recessed" (e.g., etched) back from via 86 in order to prevent traces 88 from being shorted (e.g., connected to layer 62). In other alternate embodiments, core 62 is not recessed in order to intentionally short or connect traces 88 to core 62.

Figure 2B:
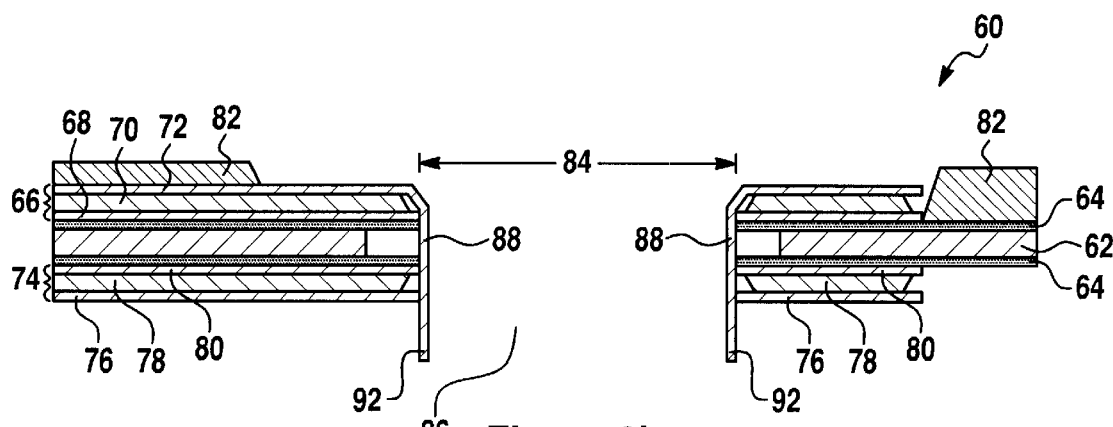
Figure 2C:
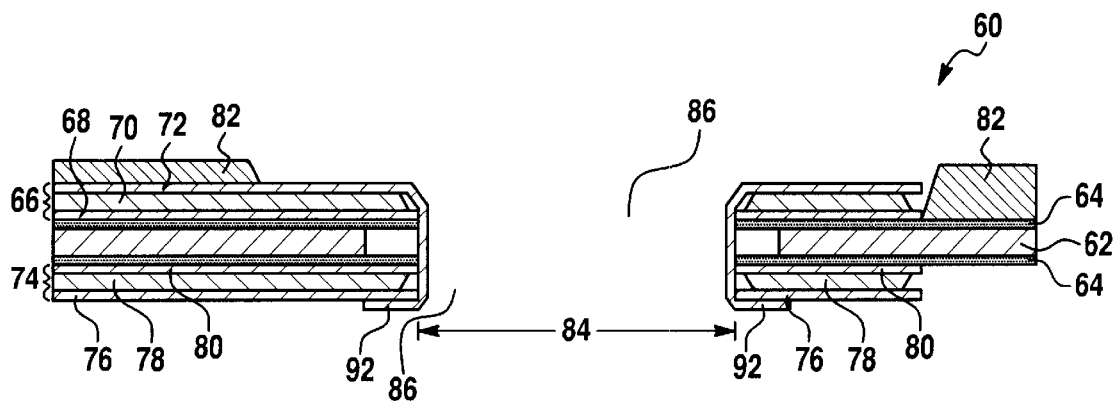

Once aperture or Via 86 has been formed, protrusions or extensions 88 are forced downward in the direction illustrated by arrow 90, and move from the position shown in FIG. 2(a) to the position shown in FIG. 2(b). In the preferred embodiment, portions 88 are forced and/or moved downward by use of air pressure, fluid pressure, mechanical force, or a lead forming device. It should be appreciated that once protrusions 88 have been forced downward into the position illustrated in FIG. 2(b), protrusions 88 each contact conductive layers or members 68, 80, and 76, and create a physical and electrical interconnection between members 76, 80, 68 and 72. End portions 92 are then "bent" or folded over portions or members 76 as illustrated in FIG. 2(c), thereby securing protrusions 88 in an operatively "connected" position (e.g., protrusions 88 operatively connect members 76, 80, 68 and 72).

Figure 2D:
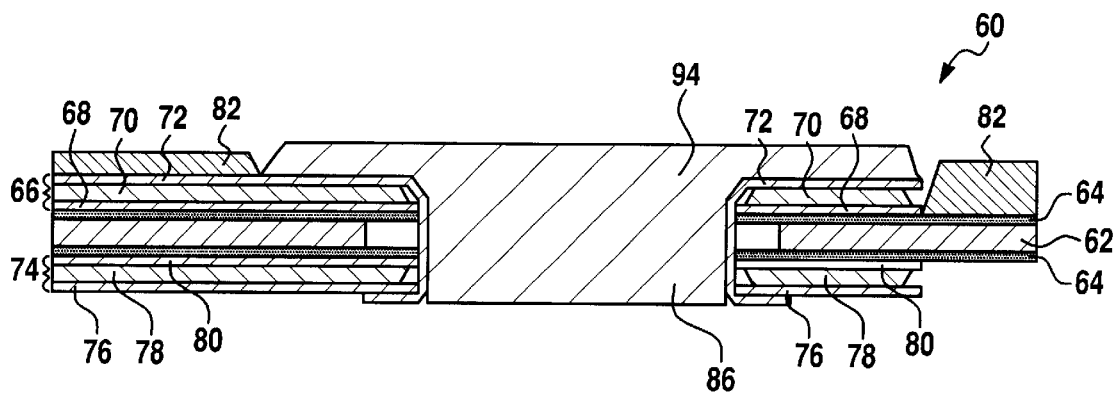
Figure 2E:
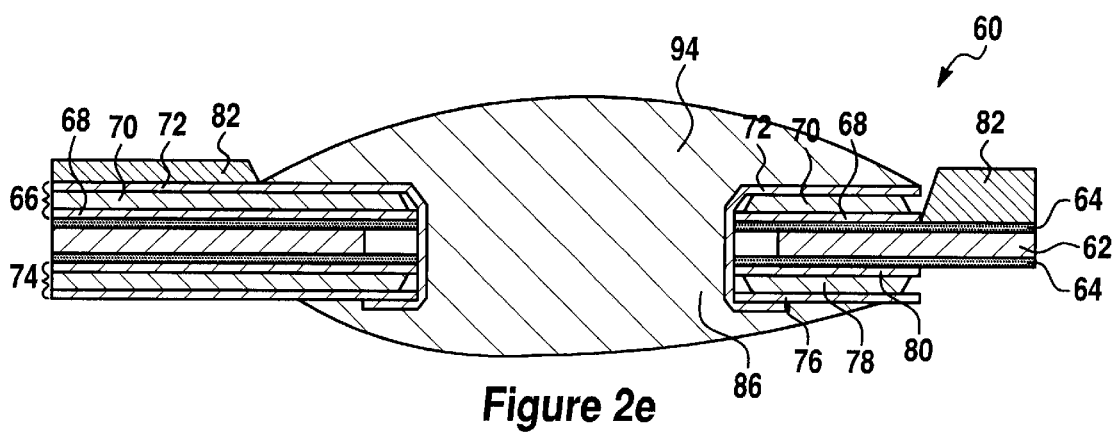

Conventional solder paste 94 is conventionally dispensed and/or inserted within aperture 86, as illustrated in FIG. 2(d). In one non-limiting embodiment, a conventional solder paste dispensing syringe is inserted into aperture 86 prior to the deformation or "bending" of protrusions 88, and is effective to deform and/or force protrusions 88 downward (e.g., into the position illustrated in FIG. 2(b)) when the syringe is inserted. As the syringe is removed, it disposes, dispenses and/or deposits solder paste or material 94 within the aperture or via 86. As illustrated in FIG. 2(e), the solder material 94 is subsequently heated or "re-flowed" and forms a robust connection between conductive layers or members 68, 72, 76, and 80. It should be appreciated, that circuit assembly 60 allows the "non-wettable" insulating layers or members 64 (i.e., layers or members 64 cannot be metallurgically bonded to conventional solder material) to be initially "bridged" or crossed-over, effective to connect members 68, 72, 76, and 80, without the use of solder material.

Figure 2F:
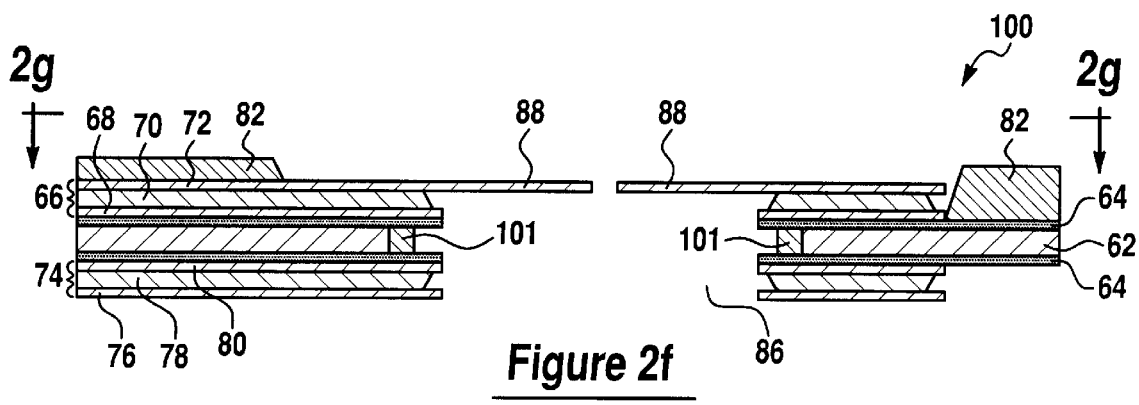
FIG. 2(f) is a sectional side view of a multi-layer circuit board being produced and/or formed in accordance with the teachings of a fourth embodiment of the invention.
Figure 2G:
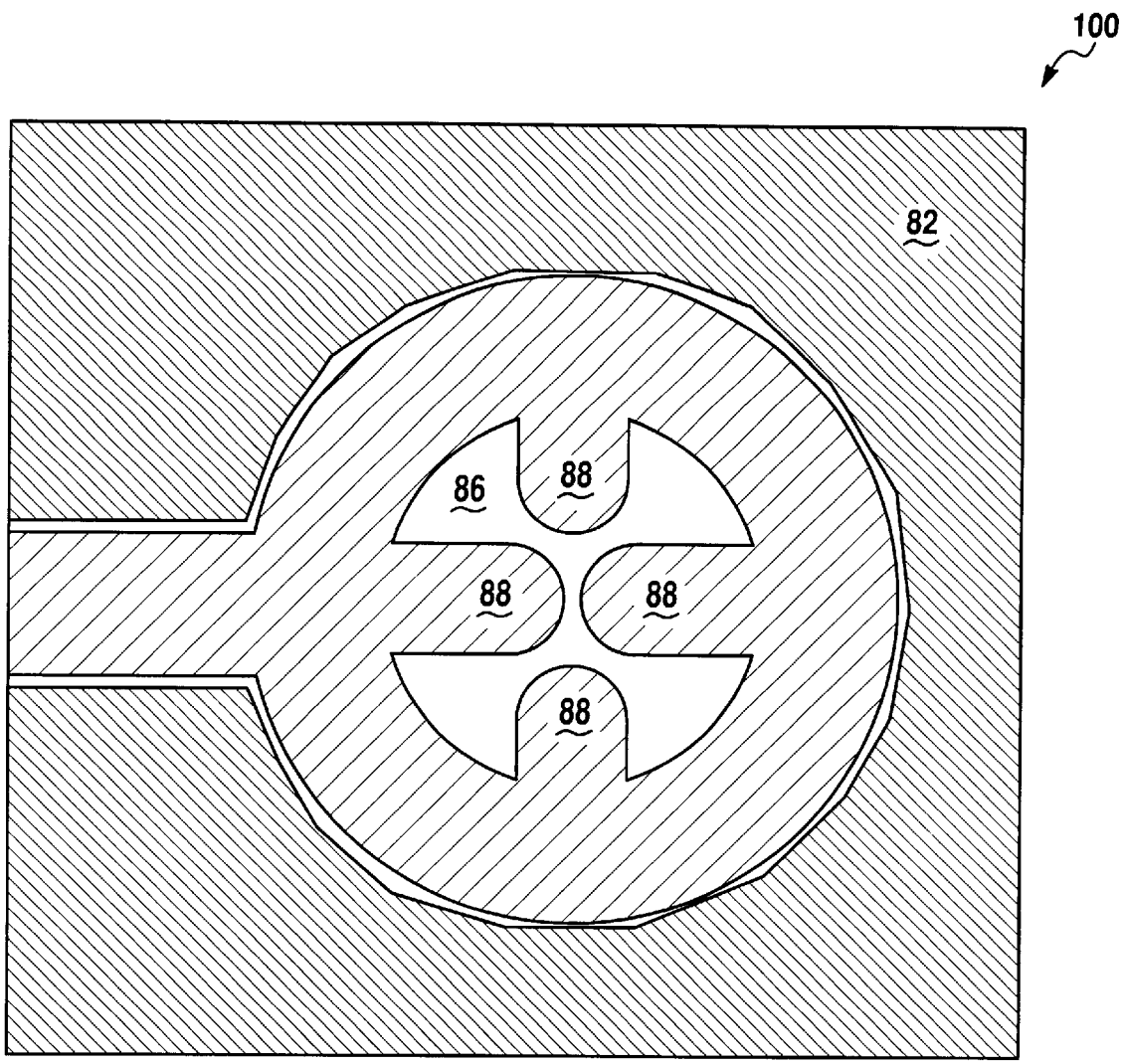
FIG. 2(g) is a top view of the multi-layer circuit board illustrated in FIG. 2(f).

Referring now to FIGS. 2(f)–(g), there is shown a circuit assembly 100 made in accordance with a fourth embodiment of the present invention. Circuit assembly 100 is substantially identical in structure and function to circuit assembly 60 with the exception that a total of four protrusions 88 are formed and/or utilized instead of two protrusions 88. In this manner, circuit assembly 100 provides a more robust and reliable connection between conducting members or layers 68, 72, 76, and 80. In one non-limiting embodiment, the dielectric insulative or "solder mask" material 101 can be applied to the via walls of the core 62 to prevent any shorting of traces 88 to core 62, as opposed to the technique used in FIGS. 2(a)–2(e) where the recessing of the core material 62 prevents shorting. It shorting of the trace 88 to the core 62 is desired then no recessing or coating of core material 62 is used.

It should be understood that the invention is not limited to the exact embodiment or construction which has been illustrated and described but that various changes may be made without departing from the spirit and the scope of the invention.

What is claimed is:

1. A method for forming a connection within a multi-layer circuit board, said multi-layer circuit board including a first circuit portion having a top surface and a bottom surface and first and second conductive members which are respectively attached to said top and said bottom surface of said first circuit portion, said method comprising the steps of:

selectively removing a portion of said first circuit portion, effective to cause a portion of said first conductive member to form an air bridge over said second conductive member;

providing a bonding tool;

imparting a force upon said air bridge by use of said bonding tool, said force being effective to collapse a portion of said air bridge; and bonding said collapsed portion of said air bridge to said second conductive member, thereby connecting said first conductive member to said second conductive member.

2. The method for forming a connection within a multi-layer circuit board of claim 1 wherein said first circuit portion comprises a core member.

3. The method for forming a connection within a multi-layer circuit board of claim 2 wherein said core member is formed from an aluminum material, and wherein said first and second conductive member are formed from a copper material.

4. The method for forming a connection within a multi-layer circuit board of claim 1 further comprising the step of:

metallizing a surface of said air bridge, effective to cause said surface to be metallurgically bondable.

5. The method for forming a connection within a multi-layer circuit board of claim 1, further comprising the step of:

applying an amount of solder material to said bonded first and second conductive members.

6. The method for forming a connection within a multi-layer circuit board of claim 1 wherein paid bonding tool comprises an ultrasonic bonding tool.

7. The method for forming a connection within a multi-layer circuit board of claim 1 wherein said bonding tool comprises a thermocompression bonding tool.

8. The method for forming a connection within a multi-layer circuit board of claim 2 wherein said portion of said core member is removed by use of a differential etching process.

9. A method for forming a connection within a multi-layer circuit board, said multi-layer circuit board including a first circuit portion having a top surface and a bottom surface and first and second conductive members which are respectively attached to said top and said bottom surface of said first circuit portion, said method comprising the steps of:

selectively removing a portion of said first circuit portion and said second conductive member effective to create an aperture within said circuit board;

selectively removing a portion of said first conductive member such that a protrusion extends over said aperture; and imparting a force upon said protrusion effective to force said protrusion into contact with said second conductive member, and wherein said protrusion at least partially defines said aperture.

10. The method for forming a connection within a multi-layer circuit board of claim 9 wherein said first circuit portion comprises a conductive core member.

11. The method for forming a connection within a multi-layer circuit board of claim 9 further comprising the step of dispensing solder within said aperture.

12. The method for forming a connection within a multi-layer circuit board of claim 11 wherein said step of imparting a force upon said protrusion is performed by use of a solder paste-dispensing syringe.

13. The method for forming a connection within a multi-layer circuit board of claim 12 wherein said step of dispensing solder within said aperture is performed by use of said dispensing syringe after said step of imparting a force upon said protrusion.

14. The method for forming a connection within a multi-layer circuit board of claim 9 wherein said first circuit portion comprises a conductive core member and wherein said first conductive member is part of a first pre-circuit assembly and said second conductive member is part of a second pre-circuit assembly.

15. The method for forming a connection within a multi-layer circuit board of claim 14 wherein said conductive core member is recessed between said first pre-circuit assembly and said second pre-circuit assembly such that said conductive core member does not contact said protrusion.

16. A method for forming a multi-layer circuit board, said method comprising the steps of:

providing an electrically conductive core member;

placing a plurality of layers of certain materials upon said core member;

providing a pre-circuit assembly having a top conductive member and a bottom conductive member, wherein said top and bottom member are separated by a pre-circuit core member;

selectively coupling said pre-circuit assembly to said plurality of layers of certain materials;

selectively removing a portion of said pre-circuit assembly to form an air bridge, wherein said air bridge is formed from said top conductive member and is disposed over said bottom conductive member;

collapsing a portion of said air bridge; and bonding said collapsed portion of said air bridge to said bottom conductive member.

17. The method of claim 16 wherein said step of placing a plurality of layers of certain materials upon said core member comprises the steps of:

placing a layer of dielectric epoxy upon said core member; and placing a layer of adhesive material upon said layer of epoxy.

18. The method of claim 16, wherein said step of selectively removing a portion of said pre-circuit assembly is achieved by differential etching.

19. The method of claim 18 wherein said step of collapsing a portion of said air bridge further comprises:

providing a bonding tool; and causing said bonding tool to impart a force upon said air bridge.

20. The method of claim 19 wherein said provided bonding tool is an ultrasonic metallurgical bonding tool.

21. The method of claim 19 wherein said provided bonding tool comprises a thermo-compression metallurgical bonding tool.

22. The method of claim 19 further comprising the step of:

metallizing said air bridge prior to collapsing said air bridge.

23. The method of claim 22 wherein said step of metallizing said air bridge comprises the step of:

immersing said air bridge in a conductive metal.

* * * * *